United States Patent [19]

Ranz et al.

[11] 3,901,710

[45] Aug. 26, 1975

[54] PHOTOGRAPHIC MATERIAL COMPRISING A LIGHT-SENSITIVE 1,4-DIHYDROPYRIDINE DERIVATIVE

[75] Inventors: Erwin Ranz, Leverkusen; Friedrich Bossert, Wuppertal; Heinz Dieter Schutz; Harald Von Rintelen, both of Leverkusen, all of Germany; Gerard Albert Delzenne, Gravenwezel; Antoine August De Jaeger, Wilrijk, both of Belgium

[73] Assignee: Agfa-Gevaert Aktiengesellschaft, Leverkusen-Bayerwerk, Germany

[22] Filed: Aug. 21, 1973

[21] Appl. No.: 390,214

[30] Foreign Application Priority Data

Aug. 26, 1972 Germany ........................... 2242106

[52] U.S. Cl. ........................ 96/67; 96/88; 96/115 R; 96/115 P; 96/35.1; 96/90 R; 260/30.2; 106/125; 106/213; 106/176

[51] Int. Cl.$^2$ ... G03C 1/76; G03C 1/68; G03C 1/00

[58] Field of Search ........... 96/88, 115 R, 67, 90 R, 96/35.1, 36.2; 260/30.2; 106/125, 213, 176

[56] References Cited

UNITED STATES PATENTS

| | | | |
|---|---|---|---|
| 3,519,424 | 7/1970 | Reynolds et al. | 96/115 R |
| 3,776,735 | 12/1973 | Bauer et al. | 96/115 R |

*Primary Examiner*—Won H. Louie, Jr.
*Attorney, Agent, or Firm*—Connolly and Hutz

[57] ABSTRACT

This invention relates to the reproduction of originals on light-sensitive copying materials by producing positive relief images using a material that contains a 1,4-dihydropyridine derivative according to the indicated formula.

5 Claims, No Drawings

PHOTOGRAPHIC MATERIAL COMPRISING A LIGHT-SENSITIVE 1,4-DIHYDROPYRIDINE DERIVATIVE

This invention relates to a photographic material which contains a 4-(2'-nitrophenyl)-1,4-dihydropyridine as light-sensitive compound for producing positive relief images.

Photographic processes for producing relief images are based on a change in the solubility of the layer after exposure and removal of parts of the layer by washing them off with a suitable solvent. There are two types of wash-off processes, those which produce negative relief images and those which produce positive relief images.

Negative relief images are obtained if the layer is rendered insoluble by exposure and positive relief images are obtained if the solubility of the layer is increased by exposure. Negative relief images are obtained, for example, by using a layer of a binder which can be crosslinked by a radical reaction and a light-sensitive sensitizer which, on exposure, yields radicals which initiate crosslinking of the binder. The solubility of the exposed areas is thereby reduced so that if a suitable solvent is used the exposed parts of the layer are preserved and the unexposed areas ware washed off.

The layers used for the production of positive relief images comprise a binder which is soluble in the solvent used for washing off and a light-sensitive substance which is so insoluble in this solvent that the layer cannot be washed off before exposure. Exposure must convert the light-sensitive substance into a compound which is more soluble in the solvent used. The exposed areas are thereby rendered capable of being washed off while the unexposed areas remain intact. The solvents used may be organic solvents, acids, alkalis or plain water, depending on the composition of the layer.

These processes have a wider range of possible applications, e.g. for the production of positive photo resists. The light-sensitive layer is applied to a metal substrate and washed off after exposure to light, so that the bare metal substrate is left in the areas which have been washed off. Images can then be produced by etching with suitable etching liquids. Light-sensitive layers of this type are also suitable for the production of Color-Proof systems in which the layers contain dyes in addition to the binder and light-sensitive substance and these dyes are then washed off with the layer. Monochrome images are thereby obtained on transparent, opaque or paper substrates. These systems can be used for the production of lay-out layers and foils for the rapid reproduction of transparent originals in various colors for projection with overhead projectors.

Processes for producing negative relief images have been described in the monograph "Light-Sensitive Systems" by J. KOSAR, John Wiley and Sons, Inc., New York-London-Sydney.

While numerous processes are already known for the production of negative relief images, those for producing positive relief images are rare. The best known of these processes is based on the conversion of o-quinonediazides of naphthalene into carboxylic acids on exposure to UV light. The exposed areas contain a carboxylic acid instead of the o-quinonediazides and can therefore be removed by means of an aqueous alkaline solution.

The processes for the production of positive relief images have certain disadvantages. In some cases they are sensitive only to the infra-red region of the spectrum and therefore have all the disadvantages of thermographic processes, e.g. a low resolution power as well as requiring the complicated apparatus used for thermocopying. In some cases, only flash exposure can be used, and this entails expensive exposure apparatus in the case of large size copies.

It is among the objects of the present invention to provide light-sensitive photographic materials for producing positive relief images, which materials will have sufficient sensitivity to light and can rapidly and easily processed to yield relief images by washing off with water.

We now have found a photographic material comprising a supported light-sensitive layer which contains a light-sensitive 4-(2'-nitrophenyl)-1-4-dihydropyridine. Particular utility is exhibited by 1,4-dihydropyridine derivatives of the following formula

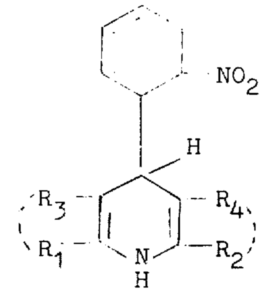

in which $R_1$ or $R_2$ - which may be the same or different, represent hydrogen or alkyl groups, preferably with up to 4 carbon atoms, $R_3$ or $R_4$ - which may be the same or different, represent cyano or acyl, preferably acyl groups which are derived from aliphatic carboxylic acids, in particular from those with up to 5 carbon atoms, or the group $COOR_5$ in which $R_5$ represents a saturated or olefinically or acetylenically unsaturated aliphatic group preferably containing up to 6 carbon atoms which may be interrupted by hetero atoms such as oxygen or by imino groups, or cycloalkyl in particular cyclopentyl or cyclohexyl;

$R_1$ and $R_3$ or $R_2$ and $R_4$ may also represent the ring members required for completing a preferably 5- or 6-membered carbocyclic or heterocyclic ring which contains a keto group and which in the case of a heterocyclic ring preferably contains O, S or NH, e.g. a cyclohexenone ring, wherein the anellated ring may be substituted for example with alkyl having preferably up to 4 carbon atoms such as methyl or ethyl.

The following compounds have proved to be particularly suitable:

1)

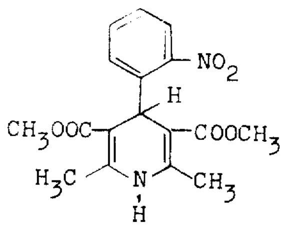

2)
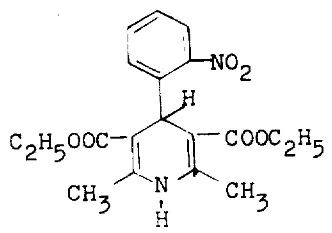
3)
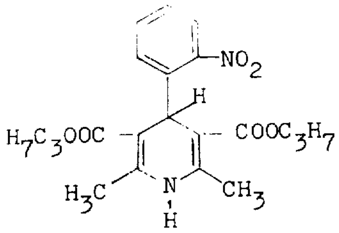
4)
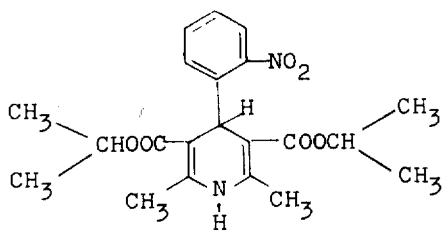
5)
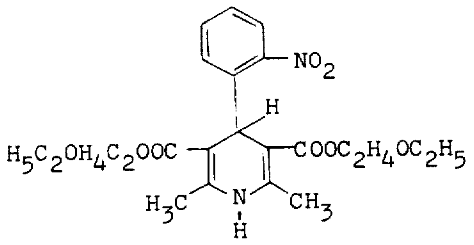
6)
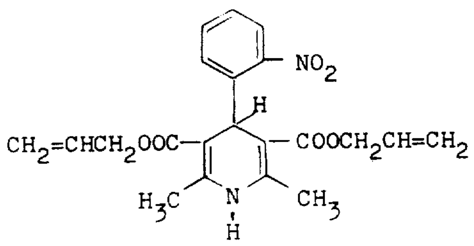
7)
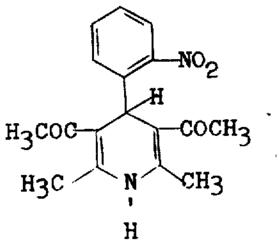
8)
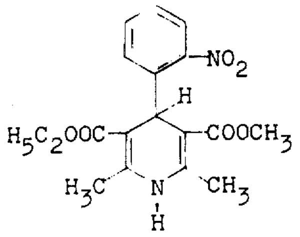
9)
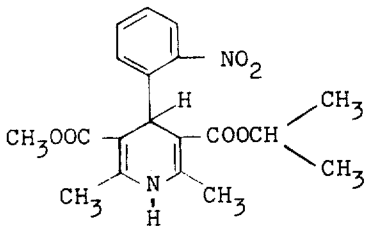
10)
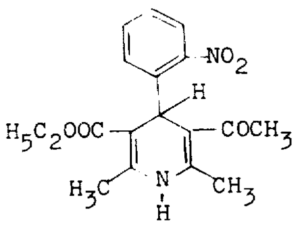
11)
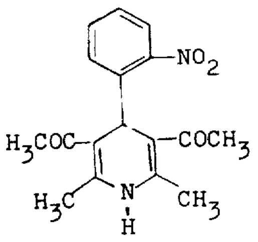
12)
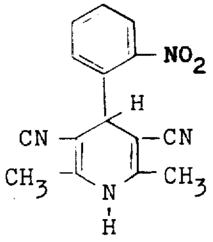
13)
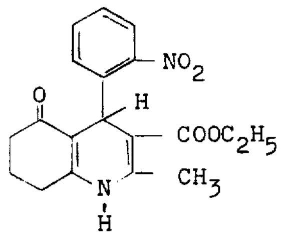
14)
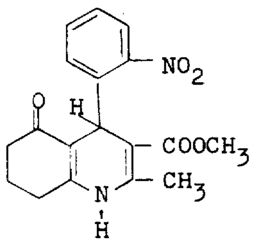

15)

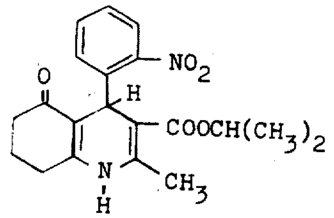

16)

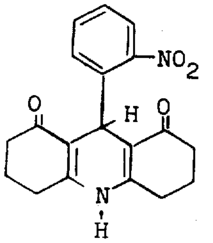

17)

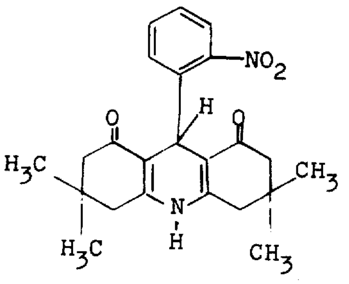

Methods of preparing the dihydropyridine derivatives used according to the invention are already known. Reference may be made to L. E. HINKEL, E. E. AYLING and W. H. MORGAN, Soc. (1931), 1855, and J. A. BERSON and E. BROWN in JACS 77, 447 (1955) or the monograph by SCHONBERG "Praparative organische Photochemie" and to German Offenlegungsschriften No. 2,003,148 and 2,005,116 for the preparation of these compounds. The synthesis of several 1,4-dihydropyridines are described in detail below; others may be prepared in analogous manner.

COMPOUND 1

Dimethyl ester of 2,6-dimethyl-4-(2'-nitrophenyl)-1,4-dihydropyridine-3,5-dicarboxylic acid.

45 g of 2-nitrobenzaldehyde, 80 cc of methyl acetate, 75 cc of methanol and 32 cc of ammonia are heated under reflux for several hours, filtered and cooled. 75 g of yellow crystals, m.p. 172° – 173°C are obtained by suction filtration.

COMPOUND 2

Diethyl ester of 2,6-dimethyl-4-(2'-nitrophenyl)-1,4-dihydropyridine-3,5-dicarboxylic acid.

30 g of yellow crystals, m.p. 122° – 124°C are obtained by heating a solution of 15 g of 2-nitrobenzaldehyde, 13 g of the ethyl ester of β-aminocrotonic acid and 13 g of ethyl acetate in 100 cc of alcohol for several hours.

COMPOUND 3

Di-n-propyl ester of 2,6-dimethyl-4-(2'-nitrophenyl)-1,3-dihydropyridine-3,5-dicarboxylic acid.

When 15 g of 2-nitrobenzaldehyde and 29 g of n-propyl ester of β-aminocrotonic acid are heated under reflux in 40 cc of alcohol or glacial acetic acid overnight, dark yellow crystals are obtained. Recrystallisation from alcohol: 15 g, m.p. 90°C.

COMPOUND 5

Di-(β-ethoxyethyl)-ester of 2,6-dimethyl-4-(2'-nitrophenyl)-1,4-dihydropyridine-3,5-dicarboxylic acid.

A solution of 15 g of 2-nitrobenzaldehyde, 36 g of β-ethoxyethyl ester of acetic acid and 10 cc of ammonia in 80 cc of alcohol is heated under reflux for several hours, filtered and cooled. 33 g of golden yellow crystals are obtained from ligroin. M.p. 93° – 96°C.

COMPOUND 6

Diallyl ester of 2,6-dimethyl-4-(2'-nitrophenyl)-1,4-dihydropyridine-3,5-dicarboxylic acid.

15 g of 2-nitrobenzaldehyde, 28 g of allyl acetate and 10 cc of concentrated ammonia in 100 cc of alcohol are heated under reflux for several hours and then suction filtered after the addition of animal charcoal. Yellow crystals are obtained on cooling and recrystallized from alcohol. 26 g, m.p. 108°C.

COMPOUND 7

Dipropargyl ester of 2,6-dimethyl-4-(2'-nitrophenyl)-1,4-dihydropyridine-3,5-dicarboxylic acid.

When a solution of 15 g of 2-nitrobenzaldehyde, 28 g of propargyl acetate and 10 cc of ammonia in 100 ml of alcohol is heated for several hours, yellow crystals are obtained on cooling. 28 g recrystallized from alcohol, m.p. 132°C.

COMPOUND 8

3-methyl-5-ethyl ester of 2,6-dimethyl-4-(2'-nitrophenyl)-1,4-dihydropyridine-3,5-dicarboxylic acid.

3-methyl-5-ethyl ester of 2,6-dimethyl-4-(2'-nitrophenyl)-1,4-dihydropyridine-3,5-dicarboxylic acid, m.p. 117°C (ethanol), was obtained by boiling a solution of 7.6 g of 2-nitrobenzaldehyde, 6.5 g of methyl acetate and 5.8 g of methylaminocrotonate in 60 ml of ethanol for 6 hours. Yield: 52% of the theory.

COMPOUND 9

3-isopropyl-5-methyl ester of 2,6-dimethyl-4-(2'-nitrophenyl)-1,4-dihydropyridine-3,5-dicarboxylic acid.

The 3-methyl-5-isopropylester of 2,6-dimethyl-4-(2'-nitrophenyl)-1,4-dihydropyridine-3,5-dicarboxylic acid, m.p. 174°C (ethanol), was obtained by boiling a solution of 24.9 g of 2-nitrobenzylidene-acetic acid methyl ester and 14.3 g of β-aminocrotonic acid isopropylester in 250 ml of ethanol for 5 hours. Yield: 62% of the theory.

COMPOUND 10

Ethyl ester of 4-(2'-nitrophenyl)-2,6-dimethyl-3-aceto-1,4-dihydropyridine-5-carboxylic acid.

After stirring a solution of 15 g of 2-nitrobenzaldehyde and 10 g of acetylacetone in 125 cc of benzene with the addition of 1 cc of piperidine for about 12 hours at room temperature, the reaction mixture is freed from water and dried and the solvent is distilled off under vacuum. The residue is heated on a water bath for 5 hours together with 13 g of ethyl β-aminocrotonate. Ether is added and the reaction product is cooled, suction filtered and recrystallized from alcohol. 10 g of yellow crystals, m.p. 174° – 176°C.

COMPOUND 11

2,6-dimethyl-(2'-nitrophenyl)-3,5-diaceto-1,4-dihydropyridine.

A solution of 15 g of 2-nitrobenzaldehyde, 20 g of acetylacetone and 10 g of ammonium acetate in 20 cc of pyridine is heated to 90° – 100°C for several hours and then poured into water. After suction filtration, 14 g of yellowish green crystals, m.p. 230°C, are obtained from methanol.

COMPOUND 12

2,6-dimethyl-4-(2'-nitrophenyl)-3,5-dicyano-1,4-dihydropyridine.

45 g of o-nitrobenzaldehyde and 51 g of aminocrotonitrile in 300 cc of glacial acetic acid are heated under reflux for 2 hours, cooled, suction filtered and washed with ether. 66 g of yellow crystals, m.p. 215° – 216°C, obtained from methanol.

COMPOUND 13

Ethyl ester of 2-methyl-4-(2'-nitrophenyl)-1,4,5,6,7,8-hexahydro-5-oxoquinoline-3-carboxylic acid.

A solution of 30 g of 2-nitrobenzaldehyde, 26 g of the ethyl ester of β-aminocrotonic acid and 22.6 g of cyclohexane-1,3-dione in 160 cc of alcohol and 60 cc of glacial acetic acid is heated to boiling for 2 hours and filtered. After cooling and suction filtration, 36 g of yellow crystals are obtained which melt at 196° – 198°C when recrystallized from alcohol.

Compounds 14 and 15 are prepared in a similar manner.

COMPOUND 14

Methyl ester of 2-methyl-4-(2'-nitrophenyl)-1,4,5,6,7,8-hexahydro-5-oxoquinoline-3-carboxylic acid, m.p. 250°C.

COMPOUND 15

Isopropyl ester of 2-methyl-4-(2'-nitrophenyl)-1,4,5,5,6,8-hexahydro-5-oxoquinoline-3-carboxylic acid, m.p. 230°C.

COMPOUND 16

1,2,3,4,5,6,7,8,9,10-decahydro-9-(4'-nitrophenyl)-1,8-dioxoacridine.

151 g of 4-nitrobenzaldehyde, 250 g of cyclohexane-1,3-dione and 100 cc of ammonia are heated to boiling in 500 cc of methanol for 6 hours. The reaction mixture is then suction filtered while hot and the residue is washed with methanol. Dark brown crystals (150 g), m.p. > 310°C.

Compound 17 is prepared in the same manner (m.p. 258° – 260°C).

To prepare the photographic material, these substances are applied either alone or in admixture with one or more light-sensitive 1,4-dihydropyridines to any support, either as solutions or finely divided and either with or without binder. UV exposure through a line or continuous-tone original results into positive relief images after washing off. The substances are applied by known methods of spraying solutions or by casting the substances from solutions or suspensions of layer-forming natural or synthetic colloids as binding agents.

The concentration of light-sensitive substances in the binding agent may be varied within wide limits. The gradation or maximum density can be controlled by varying the concentration in the binding agent and by varying the thickness of the layers. When using binding agents which swell in water, e.g. gelatin, the pH may be varied within the limits at which no deleterious change of the binder takes place such as degradation of gelatin. The substances are preferably used in quantities of 5 to 80%, based on the dry layer.

The photographic material according to the invention on the transparent or opaque support layer may also contain a dyed layer which forms a high color contrast with the support. The light-sensitive compound may then be contained either in this dyed layer or in a separate layer arranged above the dye layer.

The photographic materials according to the invention are processed as follows for producing relief images:

The material is first exposed to produce an image, the light-sensitive, hydrophobic 4-(2'-nitrophenyl)-1,4-dihydropyridine being converted in the exposed areas into a hydrophilic product by a photolytic reaction. The material is then treated with a solvent for the binding agent of the layer so that the exposed parts of the layer are washed off. The support which may be colorless or colored transparent or opaque or a metal substrate, is thereby set free in the exposed areas which have been washed off. In the case of a black light-sensitive layer on a baryta-coated paper support, for example, a dark positive relief image of the original is obtained. Conversely, when a white light-sensitive layer is applied to a dark support, a negative relief image of the original is obtained by removal of the light struck areas of the layer to reveal the dark colored support layer.

If the photographic material comprises a colorless transparent support with a colored light-sensitive layer on it a transparent colored positive image is obtained after washing off and the light struck areas of the layer are colorless and transparent. If the support layer for the photographic material is made of metal then the metal is set free in the light struck areas. Etching may then be carried out with suitable etching liquids. After removal of the remaining parts of the layer, which have not been struck by light, a metal plate with depressions etched into it is obtained, the depressions being situated in the light struck areas of the layer.

Any of a wide variety of binding agents may be used for producing relief images. The capacity of the layer to be wetted is altered to such an extent in the light struck areas of the layer that these areas become soluble while the areas which have not been exposed by light remain insoluble in the solvent used, which is preferably water, which may be alkaline or acid.

Binding agents which are soluble in water or aqueous media are preferred to simplify the processing. Both synthetic and natural filmforming products may be used, e.g. proteins, in particular gelatin, cellulose derivatives such as cellulose ethers or cellulose esters, e.g. methyl cellulose or hydroxyethylcellulose, carboxymethylcellulose, starch or starch derivatives such as starch ethers, alginic acid or its derivatives such as salts, in particular the alkali metal salts, esters or amides or carageenates. Cellulose ethers which contain short chain alkyl ether groups and which are soluble in water are preferred. Image-wise changing of the physical properties of the layer is also achieved with synthetic binding agents such as polyvinyl alcohol, partly saponified polyvinyl acetate, polyvinylpyrrolidone, saponified copolymers of vinyl acetate such as its copolymers with ethylene, or products which are soluble in organic solvents, such as polyvinyl acetate or copolymers of vinyl acetate, e.g. its copolymers with ethylene, styrene or butadiene, or the products of polymerization or copolymerization of acrylic acid or methacrylic acid or binders such as phenol formaldehyde resins (Novolaks).

The choice of binding agent depends on the solvent used. As already mentioned above, it is preferred to use water or aqueous baths, if necessary adjusted to suitable pH values. Optimum differentiation between the ease of removal of the light struck areas and the unexposed areas by washing off can be obtained, not only by a suitable choice of the solvent but also by adjusting the concentration of the light-sensitive dihydropyridine to the properties of the binding agent used for the light-sensitive layer and the properties of the solvent used for washing off. The differentiation between the exposed and unexposed areas of the layer may also be improved by adding inert substances such as dyes which by their hydrophilic or hydrophobic character influence the ease with which the various parts of the layer can be washed off.

If the material contains a colored layer, the light-sensitive compounds may either be added to this layer or arranged in a separate layer above it. If they are arranged in a separate layer, the binders used for the colored layer may be the same as or different from those used for the light-sensitive layer although it is, of course, necessary to ensure that the binding agents for the colored layer are soluble in the same solvents as the binding agents for the light-sensitive layer so that in the exposed areas, both the light-sensitive layer and the colored layer can be washed off to set free the differently colored support layer.

In a preferred embodiment of the invention, the light-sensitive 1,4-dihydroquinones is applied to the colored layer from suitable solutions without binding agents.

The usual products may be used as support layers, e.g. cellulose esters such as cellulose acetate or cellulose butyrate, polyesters, especially those based on polyethylene glycol, terephthalates or polycarbonates, preferably those based on bis-phenylolalkanes, or paper substrates, in particular baryta-coated paper, or also metal foils.

The support layers may be transparent or colored, preferably with dyes which form a high color contrast with the dye layer. If the support used includes a layer which is itself colored then it is, of course, necessary to ensure that the binding agent for this layer differs substantially from the binding agent used for the dye layer in its physical properties and especially in its solubility so that this colored layer of the support will not be damaged upon processing. The adhesion of the dye layer or of the light-sensitive layer to the support layer or its colored layer is also important. It should not be too great so that the exposed parts of the light-sensitive layer or dye lager may be dissolved out sufficiently easily but on the other hand it must, of course, be strong enough so that the layers will not separate spontaneously. None of these factors give rise to any serious difficulties. Suitable combinations of layers and binding agents for these layers can easily be found on the basis of what is already well known in this art.

As regards the choice of suitable dyes for the support and for the dye layer, there are no restrictions from the chemical point of view. As already mentioned above, the dye used in the dye layer should form a high contrast with the color of the support. This is necessary in order to obtain a high contrast image. The dyes should, of course, be insoluble in the solvents used upon processing in order to prevent migration of the dye into adjacent layers. It is, of course, necessary to prevent the dye in the dye layer from discoloring the differently colored support when preparing the material. If the support were discolored in this way, the background obtained when parts of the layer support layer are set free by washing off would be contaminated. The dye in the dye layer in which the relief image is produced may be either in the form of a solution or a heterogeneous dispersion. For a heterogeneous dispersion, the usual inorganic or organic pigment dyes are suitable. If the dye is dissolved in this layer it is, of course, necessary to prevent migration into adjacent layers during production or processing as referred to above.

The sensitivity of the materials according to the invention ranges from the ultraviolet to the shortwave visible part of the spectrum. UV lamps, mercury vapour lamps, halogen lamps, electronic flash lamps, etc. or direct daylight and sun-light are therefore suitable for exposure. The exposure time depends on factors such as the sensitivity of the light-sensitive compound and the distance of the source of light from the light-sensitive material. Exposure times of between 1/1000 second (flash) and a few minutes have generally been found satisfactory. For most materials, exposure times of between 5 and 20 seconds are sufficient for obtaining a good quality, high contrast image.

The light-sensitivity of the layers according to the invention can be increased by adding sensitizers of the usual type, e.g. Michler's ketone, Methylene blue, dimethylamino benzaldehyde and its derivatives, 4-H-quinolizin-4-ones, compounds of the naphthothiazoline series, cyanines, triphenylmethane dyes or the compounds described in French Patent Specification No. 1,513,822, British Patent Specification No. 1,148,636 or Belgian Patent Specification No. 735,896.

Compounds of the anthraquinone series are also suitable, e.g. 2-chloroanthraquinone. These substances may produce up to a 5-fold increase in the sensitivity. The concentrations in which they are used may vary within wide limits and depend on the nature of the dihydropyridine and of the sensitizer. Quantities of 0.1 to 20% by weight and preferably 1 to 10% by weight, based on the dihydropyridine, have been found to be satisfactory.

As already mentioned above, ordinary tap water is suitable for washing off the light struck areas of the layer when using the water-soluble binding agents which are preferred. The treatment time required for washing off also depends on the nature of the binding agent. Times of between about 5 seconds and one minute are generally sufficient.

According to a special embodiment of the process of the invention, removal of the exposed parts of the layer may also be carried out by transferring them to a second substrate. This is achieved by pressing the exposed layer and a receiving sheet together. Upon saturation, the exposed parts of the light-sensitive layer are torn out and transferred to the receiving sheet if this layer has a higher adhesion for hydrophilic layers. If the layer was black or dark in color, a negative image is immediately obtained on the receiving sheet while a positive image of the original is left on the original support. When this method is employed, it is necessary to adjust the bonding properties of the materials to each other. The light-struck parts of the light-sensitive layer must adhere less firmly to the original support than to the surface of the receiving sheet while the reverse applies to the unexposed areas of the layer. Since such tear-out processes are known in principle, suitable combinations of binding agents can easily be found by a few simple tests.

In the process according to the invention, exposure may be carried out either through transparent originals, using transmitted light, or with opaque originals, using reflected light in the usual manner. For reflex exposure the dyes used in the material of the present invention must be permeable to the light used. With suitable choice of the components, the time required for the whole process is between about 25 seconds and 1 minute.

Another advantage is the extreme light-fastness of the colored images. Since there are practically no restrictions with respect to dyes or pigments, it is possible to use light-fast dyes such, for example, as those used for textiles. In addition, images can easily be obtained in a very wide variety of colors on any colored background. With the large choice of known dyes available it is possible to obtain any desired combination. Another advantage is that either positive or negative copies of the original can be obtained on the same principle, depending on the color of the support and of the dye layer.

EXAMPLE 1

9 g of a blue pigment paste containing 35% by weight of pigment (e.g. product CI 74160 sold by BAYER AG under the trade name "Helioechtblau B V-Paste") are stirred into 42.5 g of a 5% solution of hydroxypropyl cellulose (e.g. the product sold by HERCULES POWDER under the trade name "Klucel G") in ethylene glycol monomethylether. 10 g of compound 1 dissolved in 600 ml of cyclohexanone are then added. The solution is cast on a baryta-coated paper. The thickness of the layer when dry is 1 $\mu$m.

Processing:

The material is exposed to contact with a transparent original, using in flash gun (T 65 of BRAUN) (exposure time approximately $10^{-3}$ seconds). The layer is then passed through sponge rollers moistened with water (e.g. wash-off apparatus Transparex W 20 of AGFA-GEVAERT AG). The light-struck parts of the layer are thereby washed off. A deep blue positive image is obtained on a white background.

If 1 g of Michler's ketone is added to the above solution of compound 1 and the solution is applied to produce a layer of the same thickness, the sensitivity to light is increased by the factor 2.2.

EXAMPLE 2

8 g of a red diazo dye (e.g. product CI 26050 sold by BAYER AG under the trade name "Ceresrot 7 B") are dissolved in 750 ml of o-dichlorobenzene. 25 g of compound 13 dissolved in 500 ml of ethylene glycol monomethylether and 600 g of a solution (20 g/l in ethyl alcohol) of hydroxypropyl cellulose are added. The solution is applied onto a polyethylene terephthalate support. The thickness of the layer is adjusted so that the density of the magenta dye when measured by transmitted light using a densitometer is 1.0.

Processing:

The material is exposed through a transparent original for 20 seconds, using a UV lamp (high pressure burner Q 600 made by HANAU) at a distance of 20 cm. The light is passed through the back of the light-sensitive layer to increase the sharpness of the image. The exposed areas of the layer are washed off as described in Example 1. A positive red image is obtained on the transparent support.

EXAMPLE 3

A layer prepared as described in Example 2 is processed as follows:

The layer is exposed behind a transparent original for 40 seconds, using the same UV source at a distance of 20 cm. The layer is then passed through a pair of rollers together with a moistened sheet of writing paper. The usual apparatus used for producing copies by the silver salt diffusion process, for example, are suitable for this purpose. By pressing the exposed material and the receiving sheet together in the moist state, the exposed areas of the light-sensitive layer, which are dyed red, are transferred to the receiving sheet. When the two sheets are separated, the exposed areas are torn out of the light-sensitive layers and transferred to the receiving sheet forming a negative relief image of the original in red on a white background thereon. A positive relief image is left on the original sheet.

EXAMPLE 4

13.5 g of a fine black pigment paste containing 35% by weight of pigment (e.g. product CI 77266 sold by BAYER AG under the trade name "Helioechtschwarz V-Paste") are stirred into 120 g of a solution (20 g/l in ethyl alcohol) of hydroxypropyl cellulose. 100 ml of ethylene glycol monomethylether and 70 ml of ethyl alcohol are then added and the mixture is cast on a matted film substrate (e.g. T 12 pm pf AGFA-GEVAERT AG). The thickness of the layer when dry is 2$\mu$m. A layer of compound 4 which is free from binder and contains about 1 g of the light-sensitive compound per $m^2$ is then applied to the dry pigment layer from a solution (33 g/l) in ethyl alcohol.

Processing:

The layer is exposed through a transparent original for 20 seconds, using the UV lamp described in Example 2 at a distance of 20 cm. The exposed material is processed as described in Example 1. A deep black positive image is obtained on a matted background.

EXAMPLE 5

35 g of fine white pigment paste with a pigment content of 70% by weight (e.g. product CI 77891 sold by BAYER AG under the trade name "Levanoxweiss RKB") are stirred into 120 g of a 2.5% aqueous solution of hydroxyethyl cellulose (e.g. the product sold by HERCULES POWDER under the trade name "Natrosol"). 250 ml of water and 10 ml of a 10% aqueous solution of saponin are added and the mixture is applied onto a polyethylene terephthalate support which is coated with a black layer on the rear side. The thickness of the dried layer is 1 $\mu$m. A layer of compound 2 which is free from binder and contains about 800 mg of substance per $m^2$ is applied to the dried pigment layer from a solution (20 g/l) in chloroform.

Processing:

The material is exposed through a transparent original for 60 seconds, using the UV lamp of Example 2 at a distance of 20 cm. A moist sponge is then rubbed over the layer to remove the light-struck areas. A positive white relief image of the original is obtained on a black background.

EXAMPLE 6

8 g of a green anthraquinone dye (the product sold by BAYER AG under the trade name "Macrolexgrun 5 B"; see also French Patent Specification No. 1,330,631) are dissolved in 750 ml of o-dichlorobenzene. 25 g of compound 1 dissolved in 500 ml of ethylene glycol monomethyl ether and 600 g of a solution (20 g/l in ethyl alcohol) of hydroxypropyl cellulose are added. The solution is applied onto a polyethylene terephthalate support. The thickness of the layer is adjusted so that the green color density is 1.0 when measured with transmitted light in a densitometer.

Processing:

The material is exposed through a transparent original for 20 seconds, using the UV lamp of Example 2 at a distance of 20 cm. The light is passed through the rear side of the light-sensitive layer to increase the sharpness of the image. The light-struck areas of the light-sensitive layer are then washed off as described in Example 1. A positive green image is obtained on a transparent background.

In a parallel test, 100 ml of a 1% solution in benzene of 2-chloroanthraquinone are added to the casting solution of the layer described above. The layer is cast to the same thickness. The ligth-sensitivity is increased by a factor of 2.5 by this method.

EXAMPLE 7

A layer is applied from the following casting solution onto an aluminium plate of the type used for producing offset printing forms:

1 g of phenolformaldehyde resin (e.g. the product "Alnovol 429 K" sold by CHEMISCHE WERKE ALBERT)
1 g of compound 1 and
50 ml of acetone.

The thickness of the layer when dry is 25 $\mu$m. The plate is exposed in a printing frame to produce an image, using a 1000 Watt mercury high pressure lamp (distance 1 m, exposure time 5 minutes).

The light-struck parts of the layer are washed off with 0.5N sodium hydroxide solution and treated with a 1% aqueous solution of $NaH_2PO_4$.

A printing form which is suitable for offset printing is obtained. The printing process is carried out in the usual manner. Up to 20,000 prints can be produced with this printing form.

EXAMPLE 8

An aluminium plate is coated with the following casting solution as described in Example 7:

20 g of phenolformaldehyde resin (e.g. the resin indicated in Example 7)
5 g of compound 2
120 ml of acetone and
5 ml of methyl glycol acetate.

20 g of casting solution are applied per $m^2$. The layer is exposed as described above and the light-struck parts of the layer are then washed off with a developer bath of the following composition:

50 g of $Na_3PO_4.12\ H_2O$
50 ml of methyl glycol
water up to 1 litre.

The layer is washed with a 1% aqueous phosphoric acid solution. The printing form obtained in this way is also suitable for the usual offset printing processes.

EXAMPLE 9

A layer is applied to a copper plate from the following casting solution by means of a whirler:

3 g of phenolformaldehyde resin (as described in Example 7)
2 g of compound 4
45 ml of acetone and
5 ml of methyl glycol.

The plate is dried at 60°C for one hour. It is exposed behind a screened original as described in Example 7 and then developed with the following bath:

30 g of $Na_2CO_3$
30 g of $Na_3PO_4.12\ H_2O$
5 g of NaOH
water up to 1 litre.

The layer is washed with a 1% aqueous solution of $NaH_2PO_4$. The copper plate is set free in the light-struck areas. It is etched in the usual manner, using an aqueous solution of $FeCl_3$. The printing form obtained is suitable for producing copies of screened originals.

If the above casting solution is applied to a support layer comprising a thin copper layer on a conventional synthetic resin foil, the material obtained in this way may be used for producing printed circuits in known manner. In that case, the layer is exposed through an original of the printed circuit, developed with 0.5N sodium hydroxide solution and washed with a 1% solution of $NaH_2PO_4$. A printed circuit is obtained when the copper layer set free in the light-struck areas is removed by etching.

What we claim is:

1. A light-sensitive photographic element for the production of positive relief images, comprising a sheet-like support carrying a light-sensitive layer containing a 1,4-dihydropyridine of the following formula:

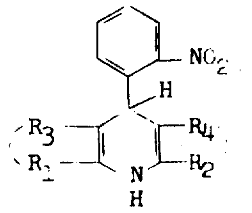

in which $R_1$ or $R_2$ represents hydrogen or alkyl;

$R_3$ or $R_4$ stands for cyano, acyl or the group $COOR_5$ in which $R_5$ represents a saturated aliphatic group which may be interrupted by hetero atoms selected from the group of oxygen and imino groups, olefinically or acetylenically unsaturated aliphatic groups; $R_1$ and $R_3$ or $R_2$ and $R_4$ may represent the ring members required for completing a 6-membered carbocyclic ring which contains a keto group including a hydrophilic film forming polymer resin or colloid means for forming the supported layer comprising the light-sensitive 1,4-dihydropyridine derivative.

2. The material of claim 1, wherein $R_1$ and $R_2$ represent methyl and $R_3$ and $R_4$ stand for the group $COOR_5$.

3. The light-sensitive photographic element as claimed in claim 1 wherein the support is coated with layer containing a dye which provides a color contrast with the support.

4. The light-sensitive photographic element as claimed in claim 3 wherein the 1,4-dihydropyridine derivative is contained in the dyed layer.

5. The light-sensitive photographic element as claimed in claim 3 wherein the 1,4-dihydropyridine derivative is contained in a separate layer superimposed on the dyed layer.

* * * * *